United States Patent
Kaneko

(10) Patent No.: US 6,720,197 B2
(45) Date of Patent: Apr. 13, 2004

(54) SURFACE-EMITTED LASER AND METHOD OF FABRICATION THEREOF

(75) Inventor: Takeo Kaneko, Suwa (JP)

(73) Assignee: Seiko Epson Corporation, Tokyo (JP)

(*) Notice: Subject to any disclaimer, the term of this patent is extended or adjusted under 35 U.S.C. 154(b) by 8 days.

(21) Appl. No.: 09/873,236

(22) Filed: Jun. 5, 2001

(65) Prior Publication Data

US 2001/0028667 A1 Oct. 11, 2001

Related U.S. Application Data

(62) Division of application No. 09/308,908, filed as application No. PCT/JP98/04484 on Oct. 5, 1998, now Pat. No. 6,266,356.

(30) Foreign Application Priority Data

Oct. 8, 1997 (JP) ............................................. 9-291598

(51) Int. Cl.$^7$ .................. H01L 21/00; H01L 27/15; H01L 31/12; H01L 33/00
(52) U.S. Cl. .................. 438/29; 438/22; 257/81; 257/83
(58) Field of Search .................. 438/31, 22, 29; 372/50, 45, 46; 257/81, 83

(56) References Cited

U.S. PATENT DOCUMENTS

| 5,086,430 A | 2/1992 | Kapon et al. | |
|---|---|---|---|
| 5,375,133 A | 12/1994 | Mori et al. | |
| 5,537,666 A | * 7/1996 | Mori et al. | 372/46 |
| 5,587,335 A | * 12/1996 | Mori et al. | 438/29 |

FOREIGN PATENT DOCUMENTS

| JP | A-60-260184 | 12/1985 |
|---|---|---|
| JP | A-1-239984 | 9/1989 |
| JP | A-5-175615 | 7/1993 |
| JP | 6-350194 | 12/1994 |
| JP | A-8-88435 | 4/1996 |
| JP | A-8-340156 | 12/1996 |
| JP | A-9-116227 | 5/1997 |
| JP | A-10-200210 | 7/1998 |

* cited by examiner

Primary Examiner—Jack Chen
Assistant Examiner—Nema Berezny
(74) Attorney, Agent, or Firm—Oliff & Berridge, PLC

(57) ABSTRACT

The present invention provides a surface-emitting laser wherein the transverse modes are controlled and phase-synchronized laser beams are emitted from a plurality of light-emitting portions to produce what appears to be a single laser beam, and a method of fabrication thereof. This laser comprises a columnar portion (20) forming part of a reflective mirror on a light-emitting side, an embedding layer (22) surrounding the periphery of the columnar portion (20), an upper electrode (23) formed on the columnar portion (20) and the embedding layer (22), and an insulating layer (18) formed below the columnar portion (20) and the embedding layer (22). A plurality of aperture portions (23a) are formed in the upper electrode (23) above the columnar portion (20), and aperture portions (18a) are formed in the insulation layer (18) at positions corresponding to the aperture portions (23a). The absolute refractive index of the embedding layer (22) is slightly smaller than that of the columnar portion (20), so that the transverse modes are controlled thereby.

6 Claims, 3 Drawing Sheets

SURFACE-EMITTED LASER AND METHOD OF FABRICATION THEREOF

This is a Division of application Ser. No. 09/308,908 filed Jul. 8, 1999, which in turn is the U.S. National Stage International Application No. PCT/JP98/04484, filed Oct. 5, 1998 now U.S. Pat. No. 6,266,356. The entire disclosure of the prior application(s) is hereby incorporated by reference herein in its entirety.

TECHNICAL FIELD

The present invention relates to a vertical-cavity surface-emitting laser and, in particular, to a surface-emitting laser that achieves a high-power laser beam having a narrow angle of radiation by emitting phase-synchronized laser beams from a plurality of light-emitting portions, together with a method of fabrication thereof.

BACKGROUND OF ART

A topic of technical concern with surface-emitting lasers is how to emit a high-power laser beam that has a narrow angle of radiation. Japanese Patent Application Laid-Open No. 8-340156 discloses a surface-emitting laser that emits phase-synchronized laser beams from a plurality of light-emitting portions, to produce what appears to be a single laser beam, due to the interference effect of light. The apparently single laser beam was observed to have a high power level and a narrow angle of radiation.

In this surface-emitting laser, a columnar portion is formed on a cladding layer on a light-emitting side, an embedding layer is formed around the columnar portion, and an electrode on a light-emitting side has a plurality of aperture portions, where peripheral portions of the aperture portions are in contact with the columnar portion. The lasing mode of light directly under the aperture portions of the electrode is different from that directly under the peripheral portions thereof, but the plurality of laser beams emitted from the aperture portions appears to form a single laser beam.

An insulating material is used as the embedding layer in this surface-emitting laser. The refractive index of an oxide such as $SiO_2$, a nitride such as $Si_3N_4$, or a compound from Group II–VI such as ZnSe that is generally used as the insulating embedding layer is greatly different from the refractive index of a compound from Group III–V such as GaAs that is a compositional element of the cladding layer. Since this means that light is enclosed excessively within the central portion of the resonator, it is impossible to cut out the higher transverse modes.

The present invention was devised in order to solve the above problems of the prior art and thus provides a surface-emitting laser wherein the transverse modes are controlled and phase-synchronized laser beams are emitted from a plurality of light-emitting portions to produce what appears to be a single laser beam, and a method of fabrication thereof.

DISCLOSURE OF INVENTION (1) A vertical-cavity surface-emitting laser in accordance with an aspect of the present invention comprises:

a columnar portion formed of at least part of a reflective mirror on a light-emitting side; an embedding layer surrounding the periphery of the columnar portion; an upper electrode formed on the columnar portion and the embedding layer, and an insulating layer formed below the columnar portion and the embedding layer, wherein:

a plurality of electrode aperture portions are formed in the upper electrode above the columnar portion;

a plurality of insulation aperture portions are formed in the insulation layer at positions corresponding to the electrode aperture portions; and the embedding layer has an absolute refractive index that is slightly smaller than that of the columnar portion.

With this aspect of the invention, insulation aperture portions are formed in the insulation layer so that current is supplied from the upper electrode, through the insulation aperture portions, and into the active layer. Light generated in correspondence with the insulation aperture portions has the same lasing mode. A plurality of phase-synchronized laser beams is thus emitted from the plurality of electrode aperture portions. This plurality of laser beams forms a single high-power laser beam with a narrow angle of radiation.

This aspect of the invention also has an embedding layer surrounding the periphery of the columnar portion, and the absolute refractive index (refractive index with respect to vacuum) of the embedding layer is made to be smaller than the absolute refractive index of the columnar portion. This configuration makes it possible to ensure that all the light is totally reflected within the columnar portion and is enclosed thereby, in a manner similar to an optical fiber.

Note that it is known that, when there is a large difference in absolute refractive indices between the core and cladding of an optical fiber, a large number of modes can be transmitted thereby. These transverse modes can therefore be controlled by ensuring that the difference in absolute refractive indices is small.

In a similar manner, the difference in absolute refractive indices is small in this aspect of the invention, so transverse modes can be controlled.

(2) With respect to the above described surface-emitting laser, it is preferable that:

a material forming the columnar portion is made to be single crystal; and a material forming the embedding layer is the same material as that of the columnar portion, but is made to be non-single crystal.

The same material has a higher density and a higher absolute refractive index when it is made single crystalline, whereas it has a slightly lower density and a slightly lower absolute refractive index when it is made non-single crystalline (polycrystalline or non-crystalline). It is therefore possible to change the absolute refractive index slightly by making the material either single crystalline or non-single crystalline.

(3) With respect to the above described surface-emitting laser, it is preferable that:

each of the electrode aperture portions has a diameter on the order of 1 to 6 μm, and the distance between adjacent electrode aperture portions is approximately not more than 7 μm.

(4) With respect to the above described surface-emitting laser, it is preferable that:

the embedding layer has a low electrical resistance.

Lowering the electrical resistance of the embedding layer in this manner makes it possible to restrain the generation of heat therein.

(5) A method of fabricating a vertical-cavity surface-emitting laser in accordance with another aspect of the present invention comprises the steps of:

forming a single crystal layer at a position above an active layer but below a reflective mirror on a light-emitting side;

forming a non-single crystal insulation layer on the single crystal layer;

forming a plurality of insulation aperture portions in the insulation layer, to form exposed portions of the single crystal layer;

growing a multi-layer film non-selectively on the insulation layer that comprises the insulation aperture portions; and forming an upper electrode on the multi-layer film, the upper electrode having electrode aperture portions corresponding to the insulation aperture portions, wherein the multi-layer film is made to be non-single crystal on the non-single crystal insulation layer and single crystal above the insulation aperture portions.

With this aspect of the invention, the single crystal layer is exposed from the insulation aperture portions, so that the multi-layer film that is grown by non-selective growth becomes a single crystal columnar portion on these insulation aperture portions and a non-single crystal (polycrystalline or non-crystalline) embedding layer on the periphery thereof. Thus the above described surface-emitting laser can be constructed in a simple manner.

(6) With respect to the above described method of fabricating a surface-emitting laser, it is preferable that:

the multi-layer film has a low electrical resistance.

Lowering the electrical resistance of the multi-layer film in this manner makes it possible to control the heat generated within the embedding layer.

BEST MODE FOR CARRYING OUT THE INVENTION

Figure 1:
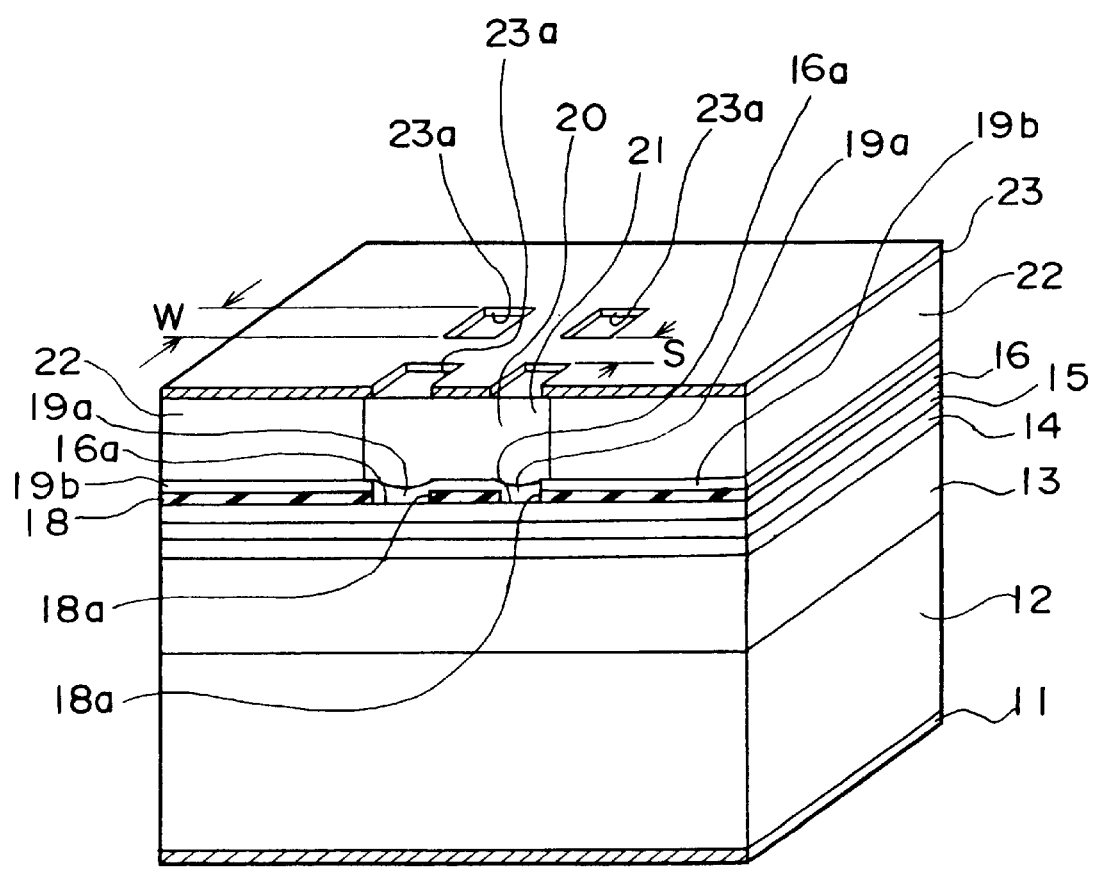
FIG. 1 is a cross-sectional view of a surface-emitting laser in accordance with an embodiment of the present invention.

A preferred embodiment of the present invention is described below with reference to the accompanying drawings. A cross-sectional view of a surface-emitting laser in accordance with the present embodiment is shown in FIG. 1.

In this figure, a lower electrode 11 is formed on a rear surface of a semiconductor substrate 12 formed of n-type GaAs or the like, by way of example.

A lower reflective mirror 13 is formed on the semiconductor substrate 12. The lower reflective mirror 13 is a distributed reflection type (a distributed Bragg reflector, abbreviated to DBR) of multi-layer reflective mirror having a reflectivity of at least 99.5% with respect to light of wavelengths in the vicinity of 800 nm, formed of 40 pairs of n-type $Al_{0.8}Ga_{0.2}As$ layers and $Al_{0.15}Ga_{0.85}As$ layers, by way of example.

A cladding layer 14, an active layer 15, and a single crystal layer 16 are formed in that order from the bottom upward on the lower reflective mirror 13. The cladding layer 14 is made of an n-type $Al_{0.7}Ga_{0.3}As$ layer, by way of example, the active layer 15 is a multi-well structure formed of $n^-$-type GaAs well layers and $n^-$-type $Al_{0.3}Ga_{0.7}As$ barrier layers, by way of example, and the single crystal layer 16 forms a cladding layer that is a p-type $Al_{0.7}Ga_{0.3}As$ layer, by way of example.

An insulation layer 18 is formed on the single crystal layer 16. The insulation layer 18 is made of an oxide film such as non-single crystal (polycrystalline or non-crystalline) $SiO_2$.

A plurality of aperture portions 18a is formed in the insulation layer 18 and a single crystal AlAs layer 19a is formed on the exposed portions 16a of the single crystal layer 16, through the aperture portions 18a. A non-single crystal AlAs layer 19b is formed on the insulation layer 18.

A columnar portion 20 is formed on the AlAs layer 19a. More specifically, the columnar portion 20 is formed on the vicinity of the aperture portions 18a of the insulation layer 18. Therefore, part of the columnar portion 20 is positioned above the single crystal layer 16, with the single crystal AlAs layer 19a and the aperture portions 18a therebetween.

The columnar portion 20 is a multi-layer film formed of alternate single crystal $Al_{0.8}Ga_{0.2}As$ layers and single crystal $Al_{0.15}Ga_{0.85}As$ layers. The AlAs layer 19a and the columnar portion 20 configure a reflective mirror on the light-emitting side.

An embedding layer 22 is formed around the periphery of the columnar portion 20. The embedding layer 22 is a multi-layer film formed of alternate non-single crystal $Al_{0.8}Ga_{0.2}As$ layers and non-single crystal $Al_{0.15}Ga_{0.85}As$ layers. In this case, "non-single crystal" means either polycrystalline or non-crystalline. The materials forming the embedding layer 22 are the same materials as those forming the columnar portion 20, except that they are made non-single crystalline. If the same materials are used, the non-single crystal form of each has a density less than that of the single crystal form, so the absolute refractive index of the non-single crystal embedding layer 22 is very slightly (by approximately 0.01) less than that of the single crystal columnar portion 20. In addition, the electrical resistance of the embedding layer 22 is lower. Note that the non-single crystal AlAs layer 19b is formed on the insulation layer 18.

An upper electrode 23 is formed on the embedding layer 22 in such a manner that it extends over a contact layer 21 that is positioned at the uppermost layer of the columnar portion 20. A plurality of to aperture portions 23a is formed in the upper electrode 23. The aperture portions 23a are formed at positions corresponding to directly above the aperture portions 18a of the insulation layer 18. In this case, the aperture portions 23a are preferably rectangular, with the width W of one side being on the order of 1 to 6 $\mu$m and the spacing S between adjacent aperture portions 23a being not more than 7 $\mu$m (more preferably not more than 5.5 $\mu$m). Note that the shape of these aperture portions 23a is not limited to rectangular and they can equally well be another shape such as circular. If the aperture portions 23a are formed to be circular, they preferably have a diameter on the order of 1 to 6 $\mu$m.

The upper electrode 23 is in contact with the contact layer 21 that is the uppermost layer of the columnar portion 20, and thus supplies current thereto.

The surface-emitting laser of the present embodiment is configured as described above. To summarize the action thereof: the configuration is such that light is generated in the active layer 15; a resonator comprises the lower reflective mirror 13 and the emitting-side reflective mirror, which is formed by the AlAs layer 19a and the columnar portion 20; and the light resonates within the resonator. The energy lost by the generation of light is supplied by the current flowing between the upper electrode 23 and the lower electrode 11. Light that transmits through the contact layer 21 of the columnar portion 20 forms an optical power. This surface-emitting laser is configured to have a resonator that is perpendicular to the semiconductor substrate 12, so it is classified as a vertical-cavity resonator type.

With the present embodiment, the electrical resistance of the embedding layer 22 is made to be lower, so that current from the upper electrode 23 flows not only from the contact layer 21 but also from the embedding layer 22 into the columnar portion 20. Therefore, the generation of heat in the embedding layer 22 is restrained.

The current is also blocked by the insulation layer 18 that is formed below the embedding layer 22. Note, however, that aperture portions 18a are formed in the insulation layer 18, so current flows into the single crystal layer 16 through these aperture portions 18a. Thus the current concentrates locally in the active layer 15 at portions corresponding to the aperture portions 18a, whereby light can be generated.

The light generated in the active layer 15 passes through the aperture portions 18a and is amplified between the upper reflective mirror comprising the columnar portion 20 and the AlAs layer 19a, and the lower reflective mirror 13.

In the present embodiment, a plurality of aperture portions 23a is formed in the upper electrode 23 to correspond to the plurality of aperture portions 18a. A laser beam is emitted from each of these aperture portions 23a and the laser beams emitted from these aperture portions 23a are phase-synchronized. Thus the plurality of laser beams appears to form a single laser beam that has a narrow angle of radiation.

The absolute refractive index of the embedding layer 22 is made to be slightly lower (by approximately 0.01) than that of the AlAs layer 19a and the columnar portion 20 which form the reflective mirror on the light-emitting side and which are surrounded by the embedding layer 22. Since this means that not all of the light is enclosed, the transverse modes can be controlled.

The above configuration makes it possible for the present embodiment to emit a high-power laser beam that has a stable angle of radiation.

An example of the method of fabricating the surface-emitting laser of FIG. 1 will now be described with reference to FIGS. 2A to 3C.

Figure 2A:
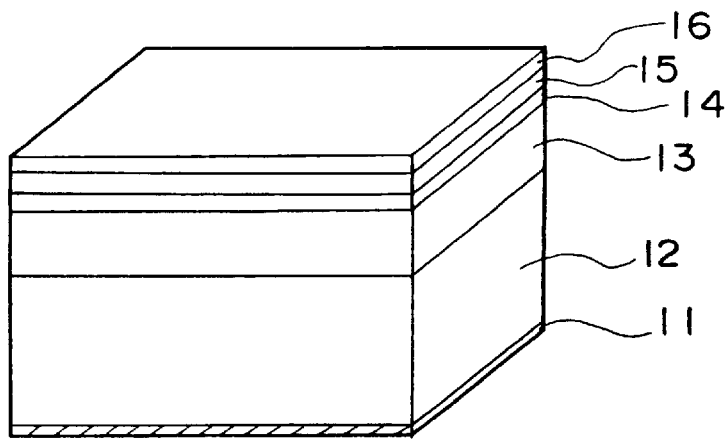
FIGS. 2A to 2C show an example of a method of fabricating a surface-emitting laser in accordance with an embodiment of the present invention, FIGS. 3A and 3B also show an example of a method of fabricating a surface-emitting laser in accordance with the embodiment of the invention.

First of all, as shown in FIG. 2A, the lower electrode 11 is formed on the rear surface of the semiconductor substrate 12 and also the layers from the lower reflective mirror 13 to the single crystal layer 16 are grown by a method such as metal organic chemical vapor deposition (MOCVD) or molecular beam epitaxy (MBE) on the upper surface of the semiconductor substrate 12.

Figure 2B:
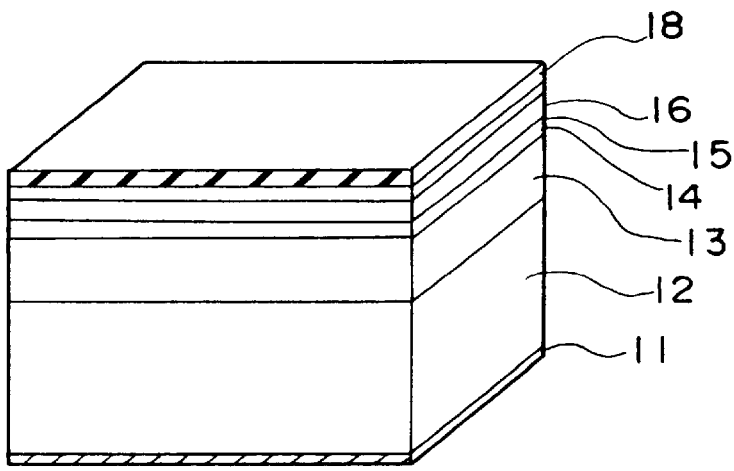

The insulation layer 18 is then formed on the single crystal layer 16, as shown in FIG. 2B. This insulation layer 18 is a non-single crystal (polycrystalline or non-crystalline) oxide film of $SiO_2$ or the like, grown by a method such as CVD or sputtering.

Alternatively, the surface of the single crystal layer 16 could be oxidized to form a non-single crystal aluminum oxide layer which can be used as the insulation layer 18.

Figure 2C:
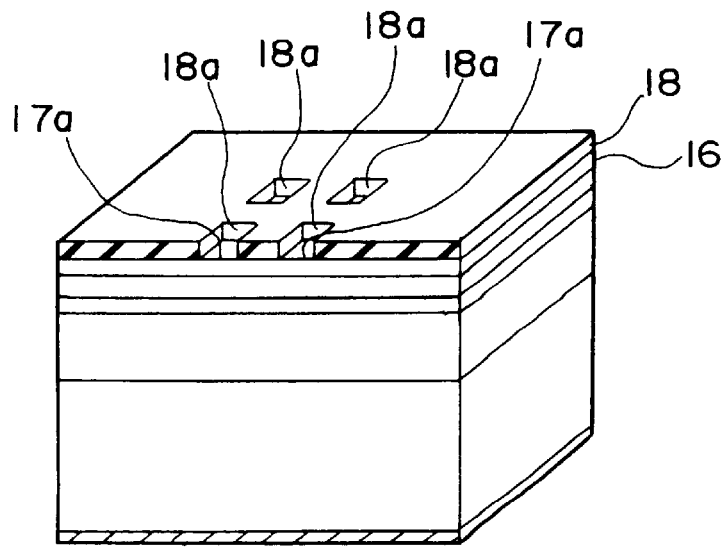

The plurality of aperture portions 18a is then formed in the insulation layer 18, to form the exposed portions 16a of the single crystal layer 16, as shown in FIG. 2C. A photolithography technique could be applied to the formation of the aperture portions 18a.

Alternatively, the configuration could be such that a thin AlGaAs layer is formed on the single crystal layer 16, an AlAs layer is formed thereon as the uppermost layer, oxidation of the AlAs layer is suppressed at room temperature and in the atmosphere, aperture portions are formed in the AlAs layer by a photolithography technique, and, after parts of the AlGaAs have been exposed, the AlAs layer is oxidized at approximately 400° C. in a steam atmosphere. In this case, the oxidized AlAs layer is equivalent to the insulation layer 18 and the exposed portions of the AlGaAs layer are equivalent to the exposed portions 16a of the single crystal layer 16.

Note that passivation is preferably applied on the surface of the single crystal layer 16. This could be done by, for example, degrease cleaning, coating with ammonium sulfide, then performing high-temperature processing, or by cleaning with ultrapure water then performing high-temperature processing.

Figure 3A:
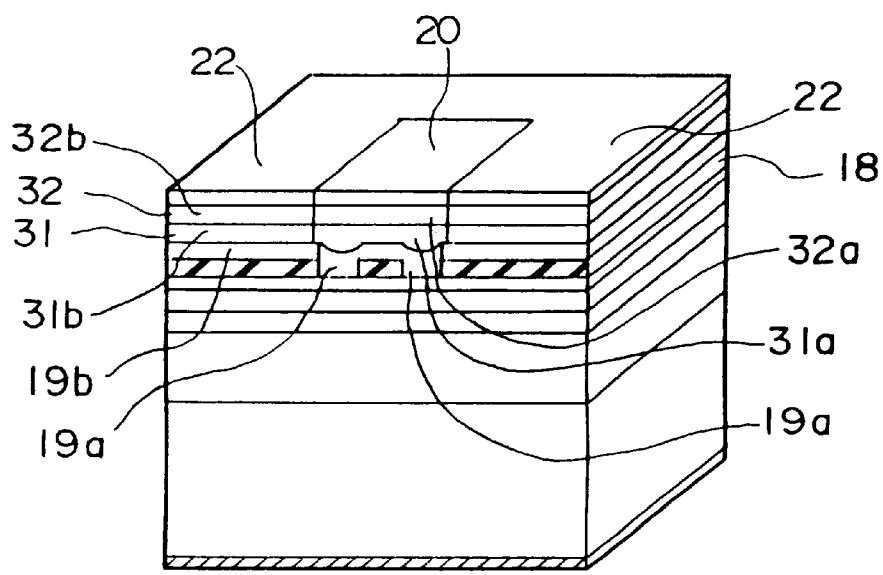

Subsequently, AlAs is grown by MOCVD on the insulation layer 18 and the single crystal layer 16, as shown in FIG. 3A. Thus AlAs is grown non-selectively to form the AlAs layers 19a and 19b on the insulation layer 18 and the single crystal layer 16.

The AlAs layer 19a is made to be single crystal on the single crystal layer 16 but the AlAs layer 19b is made to be non-single crystal (polycrystalline or non-crystalline) on the insulation layer 18. Note that the aperture portions 18a are formed in the insulation layer 18 and a region that extends further than these aperture portions 18a is made single crystalline. This means that the region above the aperture portions 18a is made completely single crystalline.

$Al_{0.15}Ga_{0.85}As$ layers 31 and $Al_{0.8}Ga_{0.2}As$ layers 32 are then formed alternately on the AlAs layers 19a and 19b.

The $Al_{0.15}Ga_{0.85}As$ layers 31 are also made to be single crystal in portions 31a thereof that are positioned above the single crystal AlAs layer 19a and non-single crystal (polycrystalline or non-crystalline) in portions 31b thereof that are positioned above the non-single crystal (polycrystalline or non-crystalline) AlAs layer 19b.

Similarly, the $Al_{0.8}Ga_{0.2}As$ layer 32 are made to be single crystal in portions 32a thereof above the single crystal portion 31a and non-single crystal (polycrystalline or non-crystalline) in portions 32b thereof above the non-single crystal (polycrystalline or non-crystalline) portion 32b.

Thus the columnar portion 20 is formed from the single crystal portions 31a and 32a and the embedding layer 22 is formed from the non-single crystal portions 31b and 32b. In other words, the single crystal columnar portion 20 and the non-single crystal embedding layer 22 can be formed thereby. The columnar portion 20 and the single crystal layer 19a form a reflective mirror on the light-emitting side.

Note that when the single crystal layer 16 has been formed, it is preferable to observe the longitudinal mode of the resonator configured by the single crystal layer 16 and the lower reflective mirror 13, and adjust this longitudinal mode by adjusting the thickness of each of the films in the multi-layer film that configures the columnar portion 20.

More specifically, the AlAs, $Al_{0.8}Ga_{0.2}As$, and $Al_{0.15}Ga_{0.85}As$ are grown by MOCVD at a substrate temperature on the order of 650 to 800° C. (preferably approximately 750° C.), a reduced pressure on the order of 10 to 200 Torr (preferably approximately 145 Torr), using TMGa, TMAl, and $AsH_3$ as source materials. In this case, the growth has no dependence on V/III ratio, since the $Al_{0.15}Ga_{0.85}As$ is grown at a V/III ratio (which expresses the mol ratio of As and Ga) of 290 and the $Al_{0.8}Ga_{0.2}As$ is grown at a V/III ratio of 95.

Figure 3B:
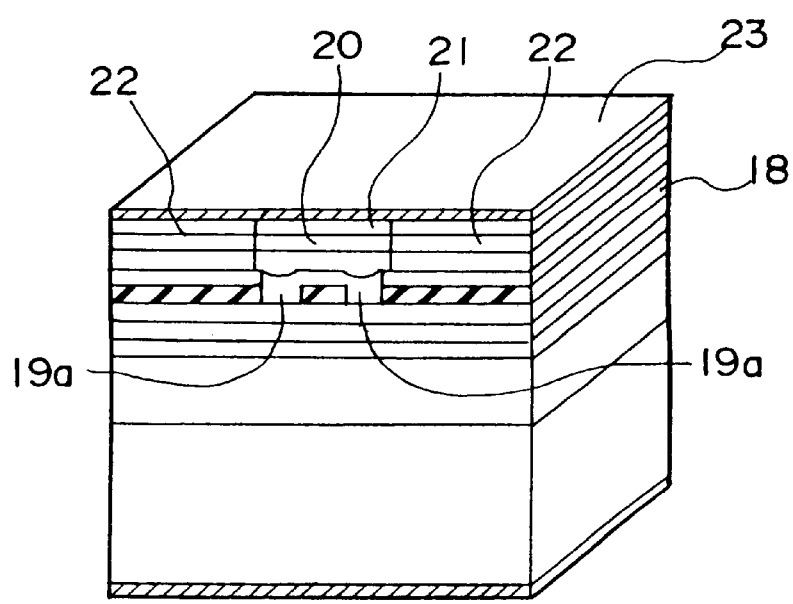

Next, metal is vapor-deposited onto the embedding layer 22 and the contact layer 21 that forms the uppermost layer of the columnar portion 20, to form the upper electrode 23, as shown in FIG. 3B. Part of the vapor-deposited metal is then removed to form the aperture portions 23a in the upper electrode 23, as shown in FIG. 1. These aperture portions 23a are formed at positions corresponding to the aperture portions 18a of the insulation layer 18.

This fabrication method makes it possible to construct the surface-emitting laser shown in FIG. 1, by a process that is simpler than that forming the columnar portion 20 by a method such as dry etching, then forming the embedding layer 22 by re-growth around the non-single crystal area.

Note that the present invention is not limited to the above described embodiment, and thus it can be modified in various different ways.

For example, a nitride semiconductor of Group III–V using N could be used instead of As in the AlAs, $Al_{0.8}Ga_{0.2}As$, and $Al_{0.15}Ga_{0.85}As$ in the step shown in FIG. 3A.

Alternatively, a second single crystal layer could be formed on the exposed portions 16a of the single crystal layer 16, so as to make an integral surface with the insulation layer 18, after the end of the step shown in FIG. 2C but before the step shown in FIG. 3A.

More specifically, the $Al_{0.15}Ga_{0.85}As$ which has a low proportion of Al and a high proportion of Ga is grown by MOCVD on the insulation layer 18 and the exposed portions 16a, from the state shown in FIG. 2C. Then, selective growth is performed because the proportion of Ga is so high, so the $Al_{0.15}Ga_{0.85}As$ grows only on the exposed portions 16a formed of single crystal AlGaAs but it does not grow at all on the insulation layer 18 formed of an oxide film, such as $SiO_2$. Note that this second single crystal layer preferably has a thickness that is capable of forming one layer of the multi-layer film reflective mirror. It is therefore preferable that the insulation layer 18 forming integral surface with the second single crystal layer is formed to have the same thickness.

What is claimed is:

1. A method of fabricating a vertical-cavity surface-emitting laser, comprising the steps of:

forming a single crystal layer at a position above an active layer but below a reflective mirror on a light-emitting side;

forming a non-single crystal insulation layer on said single crystal layer;

forming a plurality of insulation aperture portions in said insulation layer, to form exposed portions of said single crystal layer;

growing a multi-layer film non-selectively on said insulation layer that comprises said insulation aperture portions; and forming an upper electrode on said multi-layer film, said upper electrode having electrode aperture portions corresponding to said insulation aperture portions, said multi-layer film being made to be non-single crystal on said non-single crystal insulation layer and single crystal above said insulation aperture portions, and said multi-layer film including a conductive embedding layer above said non-single crystal insulation layer.

2. The method of fabricating a surface-emitting layer as defined in claim 1, said growing a multi-layer film further including growing a multi-layer film having a low electrical resistance.

3. A method of fabricating a vertical-cavity surface-emitting laser, comprising the steps of:

forming a single crystal layer at a position above an active layer but below a reflective mirror on a light-emitting side;

forming a non-single crystal insulation layer on said single crystal layer;

forming a plurality of insulation aperture portions in said insulation layer, to form exposed portions of said single crystal layer;

growing a multi-layer film non-selectively on said insulation layer and directly on said exposed portions of said single crystal layer; and forming an upper electrode on said multi-layer film, said upper electrode having electrode aperture portions corresponding to said insulation aperture portions, said multi-layer film being made to be non-single crystal on said non-single crystal insulation layer and single crystal on said exposed portions of said single crystal layer, and said multi-layer film including a conductive embedding layer above said non-single crystal insulation layer.

4. The method of fabricating a surface-emitting laser as defined in claim 3, said growing a multi-layer film further including glowing a multi-layer film having a low electrical resistance.

5. A method of fabricating a vertical-cavity surface-emitting laser, comprising the steps of:

forming a single crystal layer above an active layer;

forming a non-single crystal insulation layer on said single crystal layer;

forming a plurality of insulation aperture portions in said insulation layer, to form exposed portions of said single crystal layer;

growing a multi-layer film non-selectively on said insulation layer and said exposed portions of said single crystal layer to form a reflective mirror on a light-emitting side and a conductive embedding layer around the reflective mirror; and forming an upper electrode on said multi-layer film, said upper electrode having electrode aperture portions corresponding to said insulation aperture portions, said multi-layer film being made to be non-single crystal for said conductive embedding layer on said non-single crystal insulation layer and single crystal for said reflective mirror on said exposed portions of said single crystal layer.

6. The method of fabricating a surface-emitting laser as defined in claim 5, said growing a multi-layer film further including growing a multi-layer film having a low electrical resistance.

* * * * *